United States Patent
Yamaguchi et al.

(10) Patent No.: US 7,049,608 B2
(45) Date of Patent: May 23, 2006

(54) POSITION DETECTION APPARATUS, POSITION DETECTION METHOD, ELECTRONIC PART CARRYING APPARATUS, AND ELECTRONIC BEAM EXPOSURE APPARATUS

(75) Inventors: Takahiro Yamaguchi, Tokyo (JP); Masayoshi Ichikawa, Tokyo (JP)

(73) Assignee: Advantest Corp., Tokyo (JP)

(*) Notice: Subject to any disclaimer, the term of this patent is extended or adjusted under 35 U.S.C. 154(b) by 177 days.

(21) Appl. No.: 10/713,280

(22) Filed: Nov. 15, 2003

(65) Prior Publication Data

US 2004/0099819 A1     May 27, 2004

Related U.S. Application Data

(63) Continuation of application No. PCT/JP02/04632, filed on May 14, 2002.

(30) Foreign Application Priority Data

May 29, 2001   (JP)   ............................. 2001-161328

(51) Int. Cl.
*H01J 37/304* (2006.01)

(52) U.S. Cl. ........................ 250/492.22; 250/491.1; 250/492.2

(58) Field of Classification Search .................. None
See application file for complete search history.

(56) References Cited

U.S. PATENT DOCUMENTS

2001/0024278 A1* 9/2001 Yoshida ...................... 356/401

FOREIGN PATENT DOCUMENTS

| JP | 5-159056 | 6/1993 |
| JP | 10-134184 | 5/1998 |

* cited by examiner

*Primary Examiner*—Nikita Wells
(74) *Attorney, Agent, or Firm*—Muramatsu & Associates

(57) ABSTRACT

A position detection apparatus detecting a position of a mark similar to a template image from an input image has a calculation block. The calculation block includes phase difference calculation means and mark position detection means. The phase difference calculation means calculates a phase difference between a phase component of each frequency component when the template image is transformed into frequency components and a phase component for each frequency component when an input image is transformed into frequency components with a reference point being set at a predetermined position on the input image. The phase component difference calculated by the phase difference calculation means is transformed into a phase impulse response function, according to which the mark position detection means detects the position of the mark on the input image.

20 Claims, 10 Drawing Sheets

POSITION DETECTION APPARATUS, POSITION DETECTION METHOD, ELECTRONIC PART CARRYING APPARATUS, AND ELECTRONIC BEAM EXPOSURE APPARATUS

The present application is a continuation application of PCT/JP02/04632 filed on May 14, 2002, claiming priority from a Japanese patent application No. 2001-161328 filed on May 29, 2001, the contents of which are incorporated herein by reference.

BACKGROUND OF THE INVENTION

1. Field of the Invention

The present invention relates to a position detecting apparatus, an electronic part carrying apparatus including the position detecting apparatus, an electron beam exposure apparatus including the position detecting apparatus, and a position detection method. More particularly, the present invention relates to a position detecting apparatus, an electronic part carrying apparatus including the position detecting apparatus, an electron beam exposure apparatus including the position detecting apparatus, and a position detection method for minimizing influence of variation of a brightness distribution and deformation of a mark on an input image, and detecting a position of the mark accurately from the input image.

2. Description of the Related Art

In the manufacturing process of a large-scale integrated circuit (LSI), it is necessary to repeat a step of writing fine circuit patterns to wafer substrates, such as a semiconductor, and a step of depositing films. In order to make the LSI function as designed, the wafer substrate has to be positioned correctly in each step. Therefore, a mark is provided in advance on the wafer substrate and the wafer substrate is aligned by detecting the position of the mark. Conventionally, pattern matching processing, which compares a brightness distribution of a template image with that of the input image obtained by imaging the wafer substrate, and detects the position of the mark on the input image, is performed.

However, when depositing the films on the wafer substrate, the brightness may change locally near the mark, and deformation of the shape of the mark may be observed. Moreover, since the edge of the mark is damaged when performing chemical mechanical polishing (CMP) on the wafer substrate, the deformation of the shape of the mark is observed also in this case. Furthermore, when thickness of the lower films on the wafer substrate becomes uneven by the CMP, intensity of the reflected light may change with the differences in the layer thickness locally when a film is further deposited on the uneven films. In such a case, in the conventional pattern matching processing using the brightness, there has been a problem that the wafer substrate is not aligned correctly.

SUMMARY OF THE INVENTION

Accordingly, it is an object of the present invention to provide a position detecting apparatus, an electronic part carrying apparatus including the position detecting apparatus, an electron beam exposure apparatus including the position detecting apparatus, and a position detection method which can solve the foregoing problem. The object can be achieved by combinations described in the independent claims. The dependent claims define further advantageous and exemplary combinations of the present invention.

In order to solve the foregoing problem, according to a first aspect of the present invention, there is provided a position detection apparatus for detecting a position of a mark similar to a template image from an input image. The position detection apparatus includes: phase difference calculation means for calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and mark position detection means for transforming the phase component difference calculated by the phase difference calculation means into phase impulse response function, and for detecting a position of the mark on the input image based on the phase impulse response function.

It is preferable that the phase difference calculation means calculates phase component difference based on the frequency response function of the input image relative to the template image. The mark position detection means may calculate the phase impulse response function by two-dimensional dispersion inverse Fourier transform. The two-dimensional discrete Fourier transform may be fast Fourier transform.

The mark position detection means may include coordinates detection means for detecting coordinates, which give a value of phase impulse response function satisfying a predetermined condition, from the input image, and the position of the mark may be detected based on the coordinates detected by the mark position detection means.

The coordinates detection means may detect the coordinates, at which the value of the phase impulse response function takes the maximum. The coordinates detection means may detect the coordinates, at which absolute value of the impulse response function takes the maximum. The coordinates detection means may detect the coordinates, of which absolute value of difference between the value of phase impulse response function and a predetermined value takes the maximum. The coordinates detection means may detect the coordinates, of which the value of the phase impulse response function takes a local extremum.

The position detection apparatus may further include transformation means for transforming the input image into the frequency components. The transformation means may transform the input image into frequency components by two-dimensional discrete Fourier transform. The two-dimensional discrete Fourier transform may be fast Fourier transform.

The position detection apparatus may further include comparison area selection means for selecting a comparison area, of which the size is substantially the same as that of the template image, from the input image, and the transformation means may transform the comparison area into the frequency components with a reference point on the input image being set at coordinates on the comparison area corresponding to the predetermined position set as the reference point on the template image.

The comparison area selection means may select a plurality of comparison areas so that a predetermined proportion of each comparison area may overlap with other comparison areas. Specifically, the position detection apparatus may further include input image dividing means for dividing the input image into preliminary areas, each of which the size is smaller than that of the template image, and the comparison area selection means may select each of the comparison areas so that each of the preliminary areas may be included in predetermined positions of the comparison area, respectively.

The position detection apparatus may further include correction means for correcting pixel values of the comparison area so that pixel values at edges of the comparison area may become substantially equal to one another. The correction means may correct the pixel values of the template image so that the pixel values at the edges of the template image may become substantially equal to one another. The comparison area selection means may select the comparison area so that the number of pixels in each dimension of the comparison area is mth power of 2 (m is a positive integer), respectively. The comparison area selection means may include means for adjusting the number of pixels of the comparison area.

The mark position detection means may further include comparison area detection means for detecting the comparison area including the coordinates which give the value of the phase impulse response function satisfying a predetermined condition based on the phase impulse response function converted from the phase component difference, and the position of the mark may be detected based on the position of the comparison area in the input image and the coordinates in the comparison area.

The mark position detection means may further include: means for selecting a predetermined area from the comparison area and extracting values of phase impulse response function in the predetermined area; and means for selecting a value of the phase impulse response function, which satisfies a predetermined condition, from the extracted phase impulse response function values, and the coordinates which give the selected phase impulse response function value may be detected.

The mark position detection means may include mark judgment means for judging whether the mark is included in the comparison area by comparing the value of the phase impulse response function in the comparison area with a predetermined threshold based on the phase impulse response function which is transformed from the phase component difference of the comparison area.

The position detection apparatus may further include band extraction filter for extracting the phase component of a predetermined frequency component, and the mark position detection means may detect the position of the mark on the input image based on phase impulse response function which is converted from the phase component difference between the phase component of the template image extracted by the band extraction filter, and the phase component of the input image extracted by the band extraction filter.

The position detection apparatus may further include template image storage means storing thereon the phase component of each frequency component defined based on a value of amplitude of the frequency component of the frequency-transformed template image in association with the frequency component, and the phase component difference calculation means may calculate the phase component difference between the phase component of each frequency component corresponding to each of the frequency components stored on the template image storage means among the phase components of the frequency-transformed input image, and the phase component of each frequency component of the template image stored on the template image storage means.

The transformation means may transform the template image into frequency components. The position detection apparatus may further include template image storage means storing thereon the phase components of frequency-transformed template image in association with the frequency components. It is preferable that the number of pixels in each dimension of the template image is nth power of 2 (n is a positive integer).

The position detection apparatus may further include: template image storage means storing thereon a template reciprocal image having reciprocal frequency characteristic of the template image; convolution integral means for generating a convolution integral image of the template reciprocal image and the input image; and transformation means for transforming the convolution integral image into frequency components with a reference point being set at a predetermined point, and the phase component difference calculation means may calculate a phase component of the convolution integral image with a reference point being set at a predetermined point on the convolution integral image as the phase component difference.

According to a second aspect of the present invention, there is provided a position detection method for detecting a position of a mark similar to a template image from an input image. The method includes steps of: calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and detecting a position of the mark on the input image based on the phase impulse response function, the mark position detection step including a step of transforming the phase component difference into phase impulse response function.

The mark position detection step may include a step of converting the phase component difference into phase impulse response function, and may detect the position of the mark on the input image based on the phase impulse response function.

The phase impulse response function may be calculated in the inverse transformation step by two-dimensional dispersion inverse Fourier transform.

The mark position detection step may include a step of detecting coordinates, which give a value of phase impulse response function satisfying a predetermined condition, from the input image, and the position of the mark may be detected based on the detected coordinates. The coordinates, at which the value of the phase impulse response function takes the maximum may be detected in the coordinates detection step. The coordinates, at which absolute value of the impulse response function takes the maximum may be detected in the coordinates detection step. The coordinates, of which absolute value of difference between the value of phase impulse response function and a predetermined value takes the maximum, may be detected in the coordinates detection step. The coordinates, of which the value of the phase impulse response function takes a local extremum, may be detected in the coordinates detection step.

The position detection method may further include a step of transforming the input image into the frequency components. The input image may be transformed into frequency components with two-dimensional discrete Fourier transform in the transformation step.

The position detection method may further include a step of selecting a comparison area, of which the size is substantially the same as that of the template image, from the input image, and the comparison area may be transformed into the frequency components in the transformation step with a reference point on the input image being set at coordinates on the comparison area corresponding to the predetermined position set as the reference point on the template image.

The position detection method may further include a step of dividing the input image into preliminary areas, each of which the size is smaller than that of the template image, and the comparison area may be selected in the comparison area selection step so that each of the preliminary areas may be included in predetermined positions, respectively.

The position detection method may further include a step of correcting pixel values of the comparison area so that pixel values at edges of the comparison area may become substantially equal to one another. The comparison area may be selected in the comparison area selection step so that the number of pixels in each dimension of the comparison area is mth power of 2 (m is a positive integer), respectively.

The mark position detection step may further include a step of detecting the comparison area including the coordinates which give the value of the phase impulse response function satisfying a predetermined condition based on the phase impulse response function converted from the phase component difference, and the position of the mark may be detected based on the position of the comparison area in the input image and the coordinates in the comparison area.

The mark position detection step may further include steps of: selecting a predetermined area from the comparison area; extracting values of phase impulse response function in the predetermined area; and selecting a value of the phase impulse response function, which satisfies a predetermined condition, from the extracted phase impulse response function values, and the coordinates which give the selected phase impulse response function value may be detected in the mark position detection step.

The mark position detection step may include a step of judging whether the mark is included in the comparison area by comparing the value of the phase impulse response function in the comparison area with a predetermined threshold based on the phase impulse response function which is transformed from the phase component difference of the comparison area.

The position detection method may further include a step of extracting the phase component of a predetermined frequency component, and the position of the mark on the input image may be detected in the mark position detection step based on the phase component difference between the phase component of the template image extracted in the band extraction step, and the phase component of the input image extracted in the band extraction step.

The position detection method may further include a step of storing the phase component of each frequency component defined based on a value of amplitude of the frequency component of the frequency-transformed template image in association with the frequency component, and the phase component difference between the phase component of each frequency component corresponding to each of the frequency components stored in the template frequency storage step among the phase components of the frequency-transformed input image, and the phase component of each frequency component of the template image stored in the template frequency storage step, may be calculated in the phase component difference calculation step.

The position detection method may further include a step of transforming the template image into frequency components by two-dimensional discrete Fourier transform. The position detection method may further include a step of storing the phase components of frequency-transformed template image in association with the frequency components. The position detection method may further include a step of selecting the template image so that the number of pixels in each dimension of the template image is nth power of 2 (n is a positive integer). The position detection method may further include a step of correcting pixel values of the template image so that pixel values at edges of the template image may become substantially equal to one another.

The position detection method may further include steps of: storing a template reciprocal image having reciprocal frequency characteristic of the template image; generating a convolution integral image of the template reciprocal image and the input image; and transforming the convolution integral image into frequency components with a reference point being set at a predetermined point, and a phase component of the convolution integral image with a reference point being set at a predetermined point on the convolution integral image may be calculated as the phase component difference in the phase component difference calculation step.

The position detection method may further include steps of: transforming the template image into frequency components by two-dimensional discrete Fourier transform; and generating the template reciprocal image by calculating reciprocals of the frequency components of the transformed template image and by transforming the reciprocals by two-dimensional discrete Fourier transform.

According to a third aspect of the present invention, there is provided an electronic part carrying apparatus for transferring the electronic part including a mark similar to a template image. The electronic part carrying apparatus includes: input image imaging means for imaging the mark as the input image; a position detection apparatus for detecting the position of the mark from the input image; and electronic part moving means for gripping the electronic part and for moving the electronic part based on the position of the mark detected by the position detection apparatus. The position detection apparatus includes: phase difference calculation means for calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and a mark position detection means for detecting the position of the mark on the input image based on phase impulse response function which is transformed from the phase component difference calculated by the phase difference calculation means.

According to a fourth aspect of the present invention, there is provided an electron beam exposure apparatus for exposing a pattern on a wafer by an electron beam. The electron beam exposure apparatus include: an electron beam generating section for generating the electron beam; a wafer stage mounting thereon the wafer; input image imaging means for imaging an image of a mark as an input image, the mark being provided on either the wafer or the wafer stage, and being similar to a template image for detecting a position of a wafer; and a position detection apparatus for detecting the position of the mark from the input image. The position detection apparatus includes: phase difference calculation means for calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and a mark position detection means for detecting the position of the mark on the input image based on phase impulse response function which is transformed from the phase component difference calculated by the phase difference calculation means. The electron beam exposure apparatus may further include wafer stage moving means for moving the wafer stage based on the position of the mark detected by the position detection apparatus.

This summary of invention does not necessarily describe all necessary features so that the invention may also be a sub-combination of these described features.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 1:
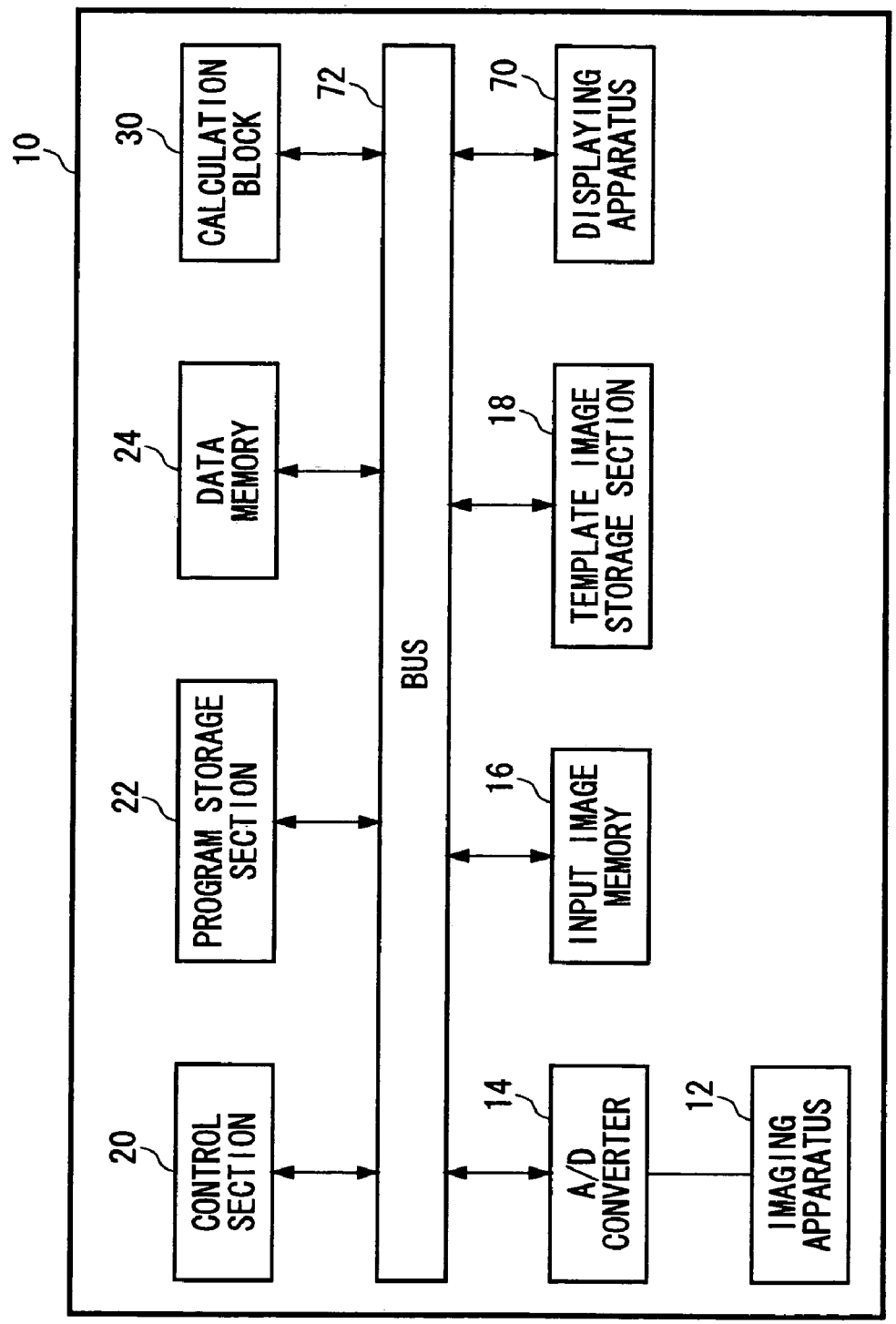
FIG. 1 is a block diagram showing a position detection apparatus according to a first embodiment of the present invention.

FIG. 1 is a block diagram showing a position detection apparatus 10 according to a first embodiment of the present invention. The position detection apparatus 10 detects a position of a mark similar to a template image from an input image. The position detection apparatus 10 includes: an imaging apparatus 12 for obtaining an image of an electronic part, e.g., a wafer, a wafer stage, an IC such as a large-scale integrated circuit (LSI), an IC package, etc., as an input image; an A/D converter 14 for converting an analog signal of the image obtained by the image capturing apparatus into a digital signal; input image memory 16 storing thereon the input image temporarily; a template image storage section 18 (template image storing means) storing thereon a template image obtained in advance; a control section 20 for controlling operation of the position detection apparatus 10; a program storage section 22 storing thereon a control program and the like for controlling the position detection apparatus 10; data memory 24 storing thereon data during the calculation temporarily; a calculation block 30 for performing calculation processing for detecting the position of the mark similar to the template image from an input image; a displaying apparatus 70 for displaying the input image or the template image; and a data bus 72 for connecting the control section 20 such as a CPU, the program storage section 22 such as ROM, the data memory 24 such as RAM, the calculation block 30, and the displaying apparatus and for transferring data among each apparatus.

For example, the template image storage section 18 is a storage device, such as a hard disk. It is preferable that template image storage section 18 stores digital data of the template image. Alternatively, the template image storage section 18 stores phase components of the frequency-transformed template image with a reference point being set at a predetermined point, in association with the frequency components. It is preferable that the template image storage section 18 stores the template image in which the number of pixels in each dimension is nth power of 2 (n is a positive integer).

Figure 2:
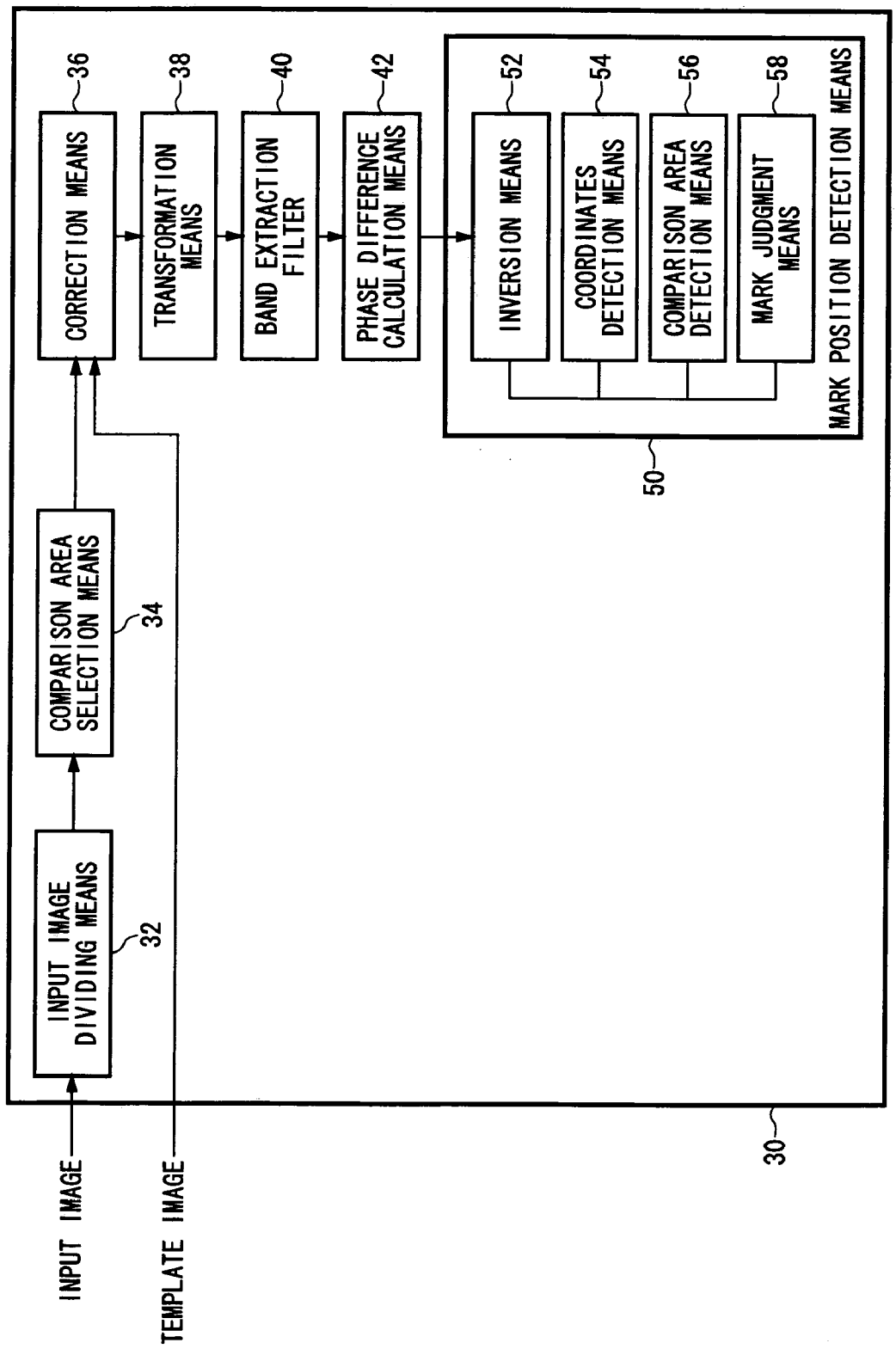
FIG. 2 is a block diagram showing a calculation block shown in FIG. 1.

FIG. 2 is a block diagram showing the calculation block 30 shown in FIG. 1.

The calculation block 30 includes input image dividing means 32, comparison area selection means 34, correction means 36, transformation means 38, a band extraction filter 40, phase difference calculation means 42, and mark position detection means 50.

The input image dividing means 32 divides the input image into a plurality of preliminary areas. It is preferable that the input image dividing means 32 divides the input image so that each of the preliminary areas is smaller than the template image. Alternatively, the input image dividing means 32 divides the input image so that each of the preliminary areas may not overlap mutually.

The comparison area selection means 34 selects a comparison area, of which the size is substantially the same as that of the template image. It is preferable that the comparison area selection means 34 selects the comparison area so that the preliminary areas of the input image divided by the input image dividing means 32 may be positioned in predetermined positions, respectively. It is also preferable that the comparison area selection means 34 selects the comparison area so that one of the preliminary areas may be located at the center of the comparison area. Alternatively, the comparison area selection means 34 selects a plurality of comparison areas from the input image.

The correction means 36 corrects pixel values of the input image. When the comparison area selection means 34 selects the comparison area from the input image, the correction means 36 corrects the pixel values of the comparison area so that the pixel values at edges of the comparison area may become substantially equal to one another. For example, the correction means 36 corrects the pixel values of the comparison area so that the pixel values at a top edge and the pixel values at a bottom edge of the comparison area may become substantially equal to each other. Moreover, the correction means 36 corrects the pixel values of the comparison area so that the pixel values at a left edge and the pixel values at a right edge of the comparison area may become substantially equal to each other. Alternatively, the correction means 36 corrects pixel values of the template image.

The transformation means 38 transforms the input image into frequency components with a reference point being set at a predetermined point on the input image. For example, the transformation means 38 transforms the input image into frequency components by Fourier transformation. It is preferable that the transformation means 38 transforms the input image into frequency components by two-dimensional discrete Fourier transform or the like. Alternatively, the two-dimensional discrete Fourier transform is fast Fourier transform. In the present embodiment, the transformation means 38 transforms the input image into frequency components by fast Fourier transform.

When the comparison area selection means 34 selects the comparison area from the input image, the transformation means 38 transforms the comparison area into frequency components with a reference point being set at a predetermined point on the comparison area. In this case, it is preferable that the transformation means 38 transforms the comparison area into frequency components with the reference point on the comparison area being set at coordinates corresponding to the predetermined point on the template image. When the comparison area selection means 34 selects a plurality of comparison areas from the input image, the transformation means 38 transforms each of the plurality of comparison areas into frequency components, respectively.

Alternatively, the transformation means 38 also transforms the template image into frequency components with a reference point being set at a predetermined point on the template image. In the present embodiment, the transformation means 38 transforms the template image into frequency components by fast Fourier transform.

The band extraction filter 40 extracts frequency components in a predetermined band from frequency components of the input image. In the present embodiment, the band extraction filter 40 is a low pass filter for extracting frequency components lower than a predetermined frequency. Alternatively, the band extraction filter 40 extracts only phase components of the frequency components in the predetermined frequency band from the frequency components of the input image. In another example, the band extraction filter 40 selects frequency bands to be extracted based on the amplitude of the frequency components of the frequency-transformed template image. For example, the band extraction filter 40 selects a predetermined number of frequency bands in order of amplitude from the frequency components of the template image. Alternatively, the band extraction filter 40 selects the frequency band, of which the amplitude is greater than a predetermined value, from the template image. The band extraction filter 40 may extract only phase components of the frequency components in the frequency band selected in such ways from the frequency components of the input image. In this case, since the band extraction filter 40 selects the frequency band to be extracted according to shape of the mark of the template image, the accuracy of phase impulse response function is improved. Thus, the band extraction filter 40 is not limited to the low pass filter which extracts only the frequency components less than the predetermined frequency.

Alternatively, the template image storage section 18 calculates the frequency band to be extracted by the band extraction filter 40 based on the amplitude of the frequency-transformed template image, and stores only the frequency components of the template image in the calculated frequency band in association with the frequency. The template image storage section 18 stores the frequency components of the template image in the frequency band of which the amplitude of the frequency components is greater than a predetermined value, as mentioned above, or stores a predetermined number of frequency components in order of amplitude. That is, the template image storage section 18 functions as the band extraction filter 40. In this case, the calculation block 30 may lack the band extraction filter 40.

Alternatively, only the frequency components in the frequency band to be extracted are supplied to the template image storage section 18. In this case, it is preferable that the position detection apparatus 10 includes extraction means for supplying the frequency components of the template image in the frequency band to be extracted to the template image storage section 18. The extraction means has the same or similar function as/to that of the band extraction filter 40. Alternatively, the template image storage section 18 stores only the phase components of the frequency components of the template image.

Alternatively, the template image storage section 18 stores the frequency components of the template image in the frequency band selected by the band extraction filter 40 in association with the selected frequency band, or the template image storage section 18 stores only the phase components of the frequency components of the template image in the frequency band selected by the band extraction filter 40 in association with the selected frequency band.

The phase difference calculation means 42 calculates difference between the phase component of each of the frequency components of the input image and the phase component of each of the frequency components of the template image. When the comparison area selection means 34 selects a plurality of comparison areas from the input image, the phase difference calculation means 42 calculates phase component difference from the phase components of the template image for each of the comparison areas. It is preferable that the phase difference calculation means 42 calculates the phase component difference based on the frequency response function of the input image relative to the frequency components of the template image.

The mark position detection means 50 detects the position of the mark on the input image based on the phase component difference calculated by the phase difference calculation means 42. The mark position detection means 50 includes inversion means 52, coordinates detection means 54, comparison area detection means 56, and mark judgment means 58.

The inversion means 52 calculates phase impulse response function by transforming the phase component difference calculated by the phase difference calculation means 42. For example, the inversion means 52 calculates phase impulse response function by inverse Fourier transform. For example, it is preferable that the inversion means 52 calculates phase impulse response function by two-dimensional dispersion inverse Fourier transform. Alternatively, two-dimensional dispersion inverse Fourier transform is high-speed inverse Fourier transform. In the present embodiment, the inversion means 52 calculates phase impulse response function by high-speed inverse Fourier transform.

The coordinates detection means 54 detects coordinates which give the value of phase impulse response function satisfying a predetermined condition from the input image. When the comparison area selection means 34 selects a plurality of comparison areas from the input image, the comparison area detection means 56 detects a comparison area including the coordinates which give the value of phase impulse response function satisfying the predetermined condition.

For example, the coordinates detection means 54 detects coordinates at which the value of phase impulse response function takes the greatest, and the comparison area detection means 56 detects a comparison area including the coordinates detected by the coordinates detection means 54.

The mark judgment means 58 judges whether a mark is included in the comparison area by comparing the value of phase impulse response function in the comparison area with a predetermined threshold. When the value of phase impulse response function in the comparison area is greater than the predetermined threshold, the mark judgment means 58 judges that a mark is included in the comparison area. When the mark judgment means 58 judges that a mark is not included in all of the plurality of comparison areas, the input image dividing means 32 may divide the input image into the preliminary areas once again at different boundaries.

When the mark judgment means 58 judges that a mark is not included in all of the plurality of comparison areas, the mark judgment means 58 notifies to the control section 20 that a mark is not included in the input image. Thereby, when a mark is not included in the input image, false recognition of the position of the mark and incorrect processing on the wafer are prevented.

Moreover, in another example, the coordinates detection means 54 further includes means for extracting only the values of the phase impulse response function in a predetermined area among the values of the phase impulse response function in the comparison area, and means for selecting the value of the phase impulse response function satisfying the predetermined condition from the extracted values of the impulse response function. In this case, the coordinates detection means 54 detects the coordinates at which the selected phase impulse response function value is given. For example, the predetermined area is an area not being influenced by the correction performed by the correction means 36 in the comparison area.

Figure 3:
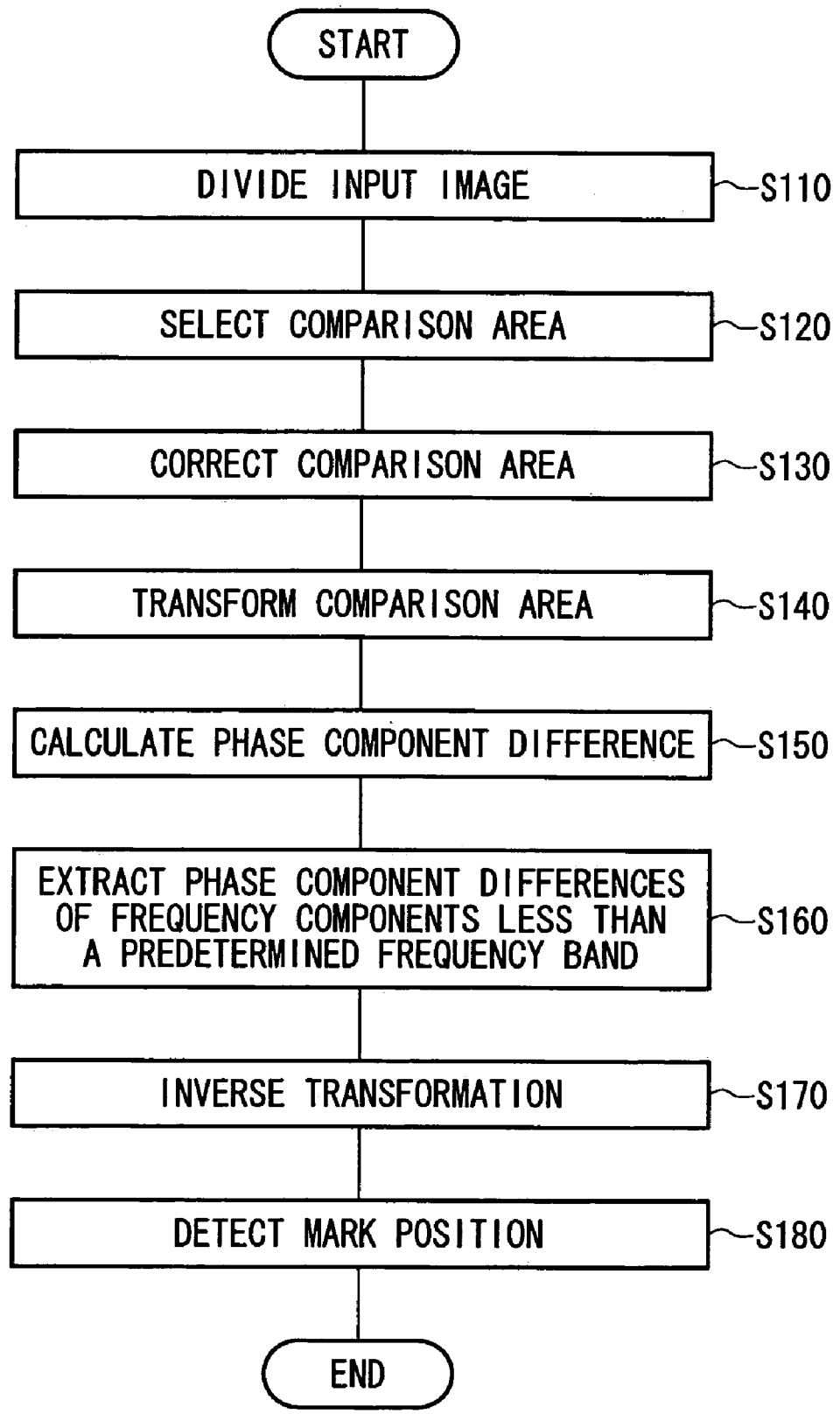
FIG. 3 is a flow chart showing steps of detecting a position of a mark similar to a template image from an input image by the position detection apparatus according to the present embodiment.

FIG. 3 is a flow chart showing steps of detecting the position of the mark similar to the template image from the input image by the position detection apparatus 10 according to the present embodiment. First, the input image dividing means 32 divides the input image into a plurality of preliminary areas (S110) When the size of the input image is substantially the same as that of the template image, the step may be omitted.

Next, the comparison area selection means 34 selects a comparison area having substantially the same size as the template image from the input image so that each of the preliminary areas are included in predetermined positions, respectively (S120). The correction means 36 corrects the pixel values of the comparison area so that the pixel values at the edges of the comparison area may become substantially equal to one another (S130). The transformation means 38 transforms the comparison area into frequency components by fast Fourier transform (S140).

In the present embodiment, the correction means 36 may correct the pixel values of the template image in S130 so that the pixel values at the edges of the comparison area may substantially equal to one another. Alternatively, the transformation means 38 transforms the template image into frequency components by fast Fourier transform in Step 140. In another example, the template image storage section 18 stores the data of a template image of which the pixel values have been corrected in advance and transformed into frequency components.

The phase difference calculation means 42 calculates differences between the phase component of each of the frequency components in the comparison area, and the phase component of each of the frequency components of the template image (S150). The band extraction filter 40 extracts only the phase component differences of the frequency components less than a predetermined frequency band among the phase component differences calculated by the phase difference calculation means 42 (S160). The inversion means 52 calculates phase impulse response function by transforming the phase component differences calculated by the phase difference calculation means 42 (S170). The mark position detection means 50 detects the position of the mark on the input image based on the phase impulse response function (S180).

Hereinafter, each step shown in the flow chart of FIG. 3 will be explained in detail.

Figure 4:
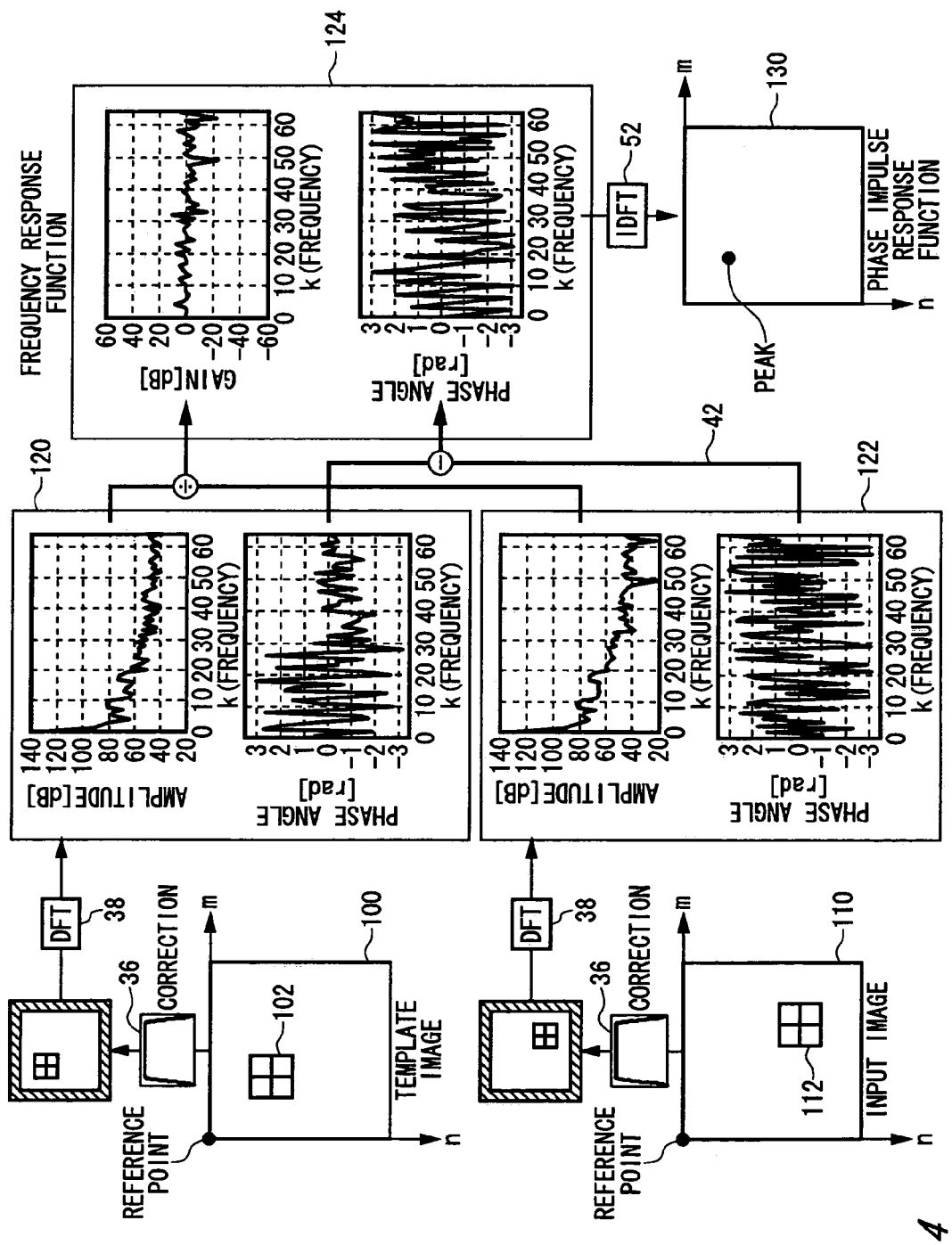
FIG. 4 is a schematic view of a first example of detecting the position of the mark similar to the template image from the input image by the position detection apparatus according to the present embodiment.
Figure 5:
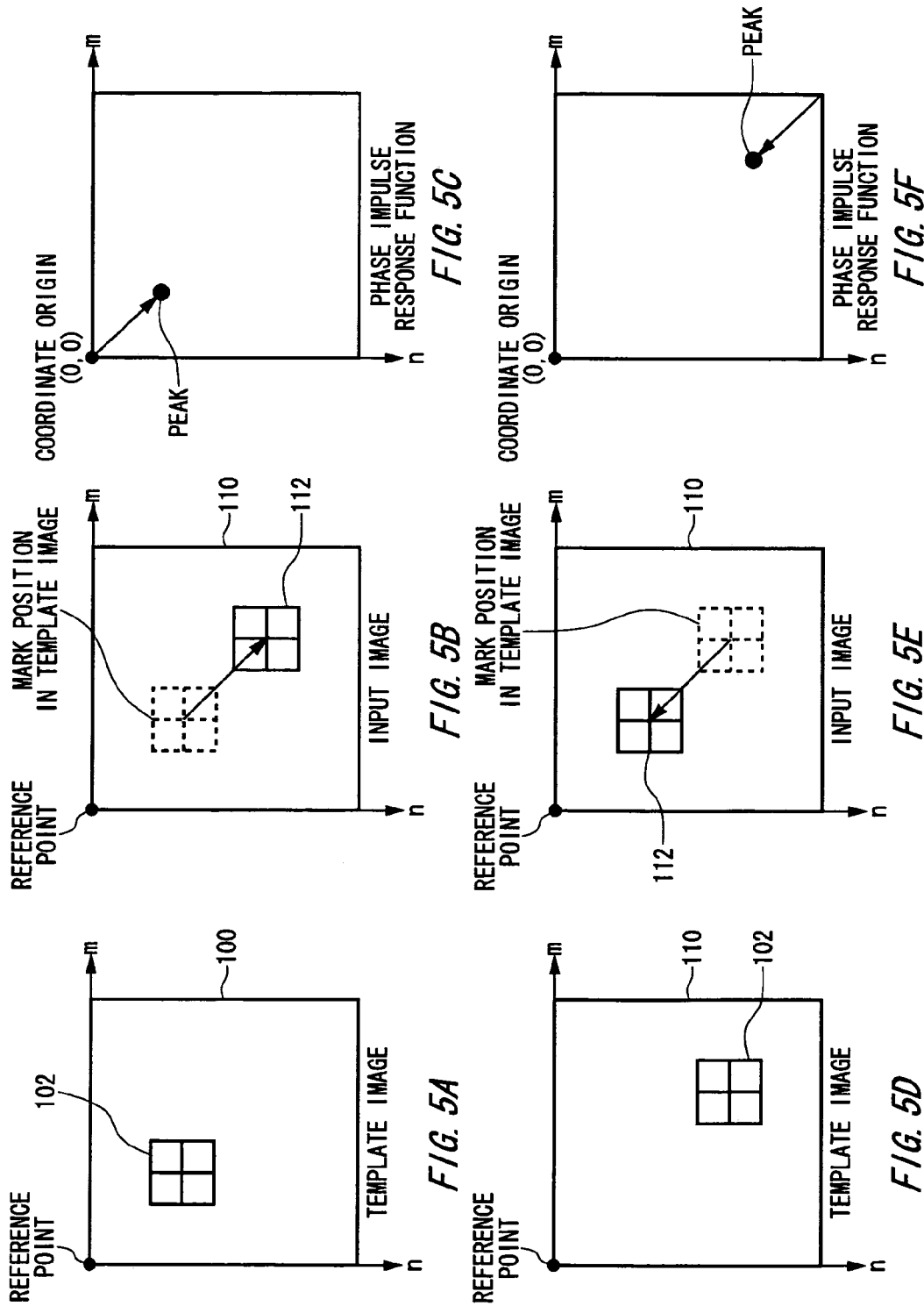
FIGS. 5A to 5F are schematic views showing that phase impulse response function expresses distance between the mark on the template image and the mark on the input image.

FIG. 4 is a schematic view of a first example of detecting the position of the mark similar to the template image from the input image by the position detection apparatus 10 according to the present embodiment.

In this example, the size of the input image 110 is substantially the same as that of the template image 100. The template image 100 includes a mark 102. The input image 110 includes a mark 112 similar to the mark 102 included in the template image 100.

The correction means 36 applies two-dimensional windowing function to the input image 110 so that the pixel values of the top edge and the bottom edge of the input image 110 and the pixel values of the left edge and the right edge of the input image 110 may become substantially the same as each other, respectively. It is preferable that the correction means 36 corrects the pixel values of the input image 110 using a cosine taper window (Tukey window). In the present embodiment, the correction means 36 corrects the pixel values of the input image 110 using rectangle, axial-symmetric, two-dimensional cosine taper window. Here the rectangle, axial-symmetric, two-dimensional cosine taper window is a windowing function for correcting the pixel value so that the amplitude becomes 1.0 in the rectangle area ($0<=|q|<=(1-\alpha)Q/2$ and $0<=|r|<=(1-\alpha)R/2$), and is tapered like a cosine curve to zero in the vicinity of the edges of the window, where window size is defined as $Q \times R$. It is preferable that the correction means 36 determines the size of the rectangle area by adjusting the value of $\alpha$. In addition to the input image, the correction means 36 corrects the pixel values of the template image in a similar manner.

Thus, since the correction means 36 corrects the pixel values so that the pixel values at the edges of the input image 110 may become equal to each other, in case the transformation means 38 transforms the input image 110 into frequency components, the pixel values of the input image 110 change continuously, and spurious due to the discontinuity of the pixel values is reduced.

The transformation means 38 transforms the template image 100 and the input image 110 into frequency components by fast Fourier transform (DFT) respectively with a reference point being set at coordinate origin of m-axis and n-axis (0, 0). In this example, the transformation means 38 transforms the template image by fast Fourier transform using the following equations.

$$X(k,l)=F[x(m,n)]=|X(k,l)|e^{j\theta_X(k,l)}$$

$$T(k,l)=F[t(m,n)]=|T(k,l)|e^{j\theta_T(k,l)}$$

Where, T(k, l) is a frequency component of the template image transformed by fast Fourier transform, X(k, l) is a frequency component of the input image transformed by fast Fourier transform, t(m, n) is a pixel value at the coordinates (m, n) on the template image 100, and x(m, n) is a pixel value at the coordinates (m, n) on the input image 110.

As shown in a graph 120 and a graph 122, each frequency component of the template image transformed by fast Fourier transform T(k, l) and each frequency component of the input image transformed by fast Fourier transform X(k, l) are expressed with the amplitude and the phase component. The phase difference calculation means 42 calculates the difference between the phase component of the frequency component T(k, l) of the template image, and the phase component of the frequency component X(k, l) of the input image. A Graph 124 shows the phase component difference calculated by the phase difference calculation means 42. The phase difference calculation means 42 calculates the frequency response function H(k, l) of the frequency component X(k, l) of the input image and the frequency component T(k, l) of the template image by the following equations.

$$H(k,l) = \frac{X(k,l)T^*(k,l)}{T(k,l)T^*(k,l)} = \frac{|X(k,l)||T(k,l)|}{|T(k,l)|^2}e^{j(\theta_X(k,l)-\theta_T(k,l))}$$

The phase difference calculation means 42 extracts phase component $\theta_H(k, l)$ from the frequency response function H(k, l) by the following equation.

$$\theta_H(k,l)=ARG[H(k,l)]=\theta_X(k,l)-\theta_T(k,l)$$

Where ARG[H(k, l)] is the principal value of the phase component.

The inversion means 52 calculates phase impulse response function $h_{phase}(m, n)$ by the following equation using phase component $\theta_H(k, l)$ by high-speed inverse Fourier transform (IDFT).

$$h_{phase}(m,n)=F^{-1}[e^{j\theta_H(k,l)}]=F^{-1}[e^{j(\theta_X(k,l)-j\theta_T(k,l))}]$$

When the mark 112 is included in the input image 110, the value of phase impulse response function $h_{phase}(m, n)$ of the coordinates (m, n), which indicates difference between the position of the mark 112 on the input image 110 and the position of the mark 102 on the template image 100, becomes large. The image 130 shows the value of the phase impulse response function. In the image 130, the peak value of the phase impulse response function appears at the coordinates indicating a distance between the coordinates of the mark 112 on the input image 110 and the coordinates of the mark 102 on the template image 100.

Since the inversion means 52 detects the position of the mark from the input image based on the phase impulse response function which is transformed from only the phase component difference, the position of the mark is detectable with sufficient accuracy from the input image while minimizing influence of variation of brightness distribution and deformation of the mark on the input image.

For example, the coordinates detection means 54 detects the peak of the phase impulse response function, e.g., the coordinates at which the value of the phase impulse response function takes the maximum in the input image, as the coordinates satisfying the predetermined condition, or the coordinates detection means 54 detects the coordinates at which the absolute value of the impulse response function takes the maximum.

Alternatively, the coordinates detection means 54 further includes means for judging whether each of the values of the phase impulse response function is positive or negative. For example, when the coordinates detection means 54 judges that the phase impulse response function at coordinates, where the absolute value of the phase impulse response function takes the maximum, is negative, the coordinates detection means 54 detects the coordinates where the absolute value of the difference between the phase impulse response function and a predetermined value takes the maximum. Alternatively, the coordinates detection means 54 detects the coordinates where the value of the phase impulse response function takes a local extremum.

When the coordinates detection means 54 includes the means for judging whether the value of the phase impulse response function is positive or negative, even if the mark on the input image is reversed and the value of the phase impulse response function takes a negative value, the position of the mark on the input image is correctly detectable.

FIGS. 5A to 5F are schematic views showing that the phase impulse response function expresses distance between the mark on the template image and the mark on the input image.

FIG. 5A shows the template image 100. FIG. 5B shows the input image 110. FIG. 5C shows the phase impulse response function. The phase impulse response function includes a peak at coordinates indicating the position of the mark 112 on the input image 110 relative to the mark 102 on the template image 100. As shown in FIG. 5B, the distance between the coordinate origin and the coordinates where there is the peak of the phase impulse response function is equal to the distance between the mark 112 on the input image 110 and the mark 102 on the template image 100 when stacking the template image 100 and the input image 110 with reference points on the images being aligned.

FIGS. 5D and 5E show the template image 100 and the input image 110 when the distance between the reference point and the position of the mark 112 on the input image 110 is less than the distance between the reference point and the mark 102 on the template image 100. In this case, as shown in FIG. 5F, the coordinates of the peak of the phase impulse response function is expressed by a negative vector. The coordinates detection means 54 judges whether the vector of the phase impulse response function is positive or negative based on the position of the mark 102 on the template image 100 and the coordinates of the detected peak of the phase impulse response function. Alternatively, the position detection apparatus 10 further includes means for selecting the template image 100 so that the mark 102 is positioned closer to the reference point than the mark 112.

Figure 6:
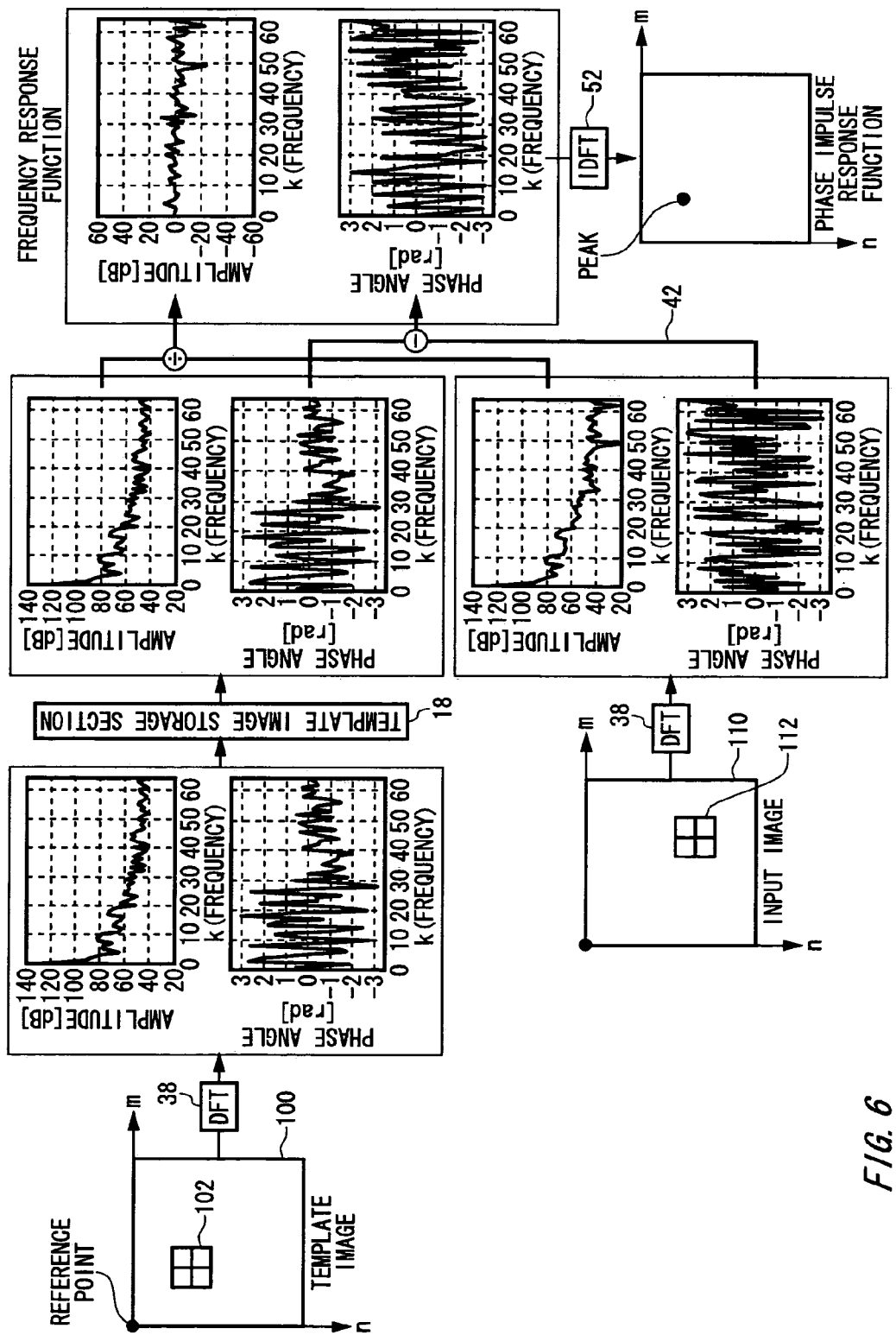
FIG. 6 is a schematic view of a second example of detecting the position of the mark similar to the template image from the input image by the position detection apparatus according to the present embodiment.

FIG. 6 is a schematic view of a second example of detecting the position of the mark similar to the template image from the input image by the position detection apparatus 10 according to the present embodiment.

In this example, the size of the input image 110 is substantially the same as that of the template image 100. Moreover, the template image 100 includes the mark 102. The input image 110 includes a mark 112 similar to the mark 102 included in the template image 100.

In this example, the transformation means 38 transforms the template image into frequency components in advance. Then, the template image storage section 18 stores the phase components of the template image in association with the frequency. Alternatively, the position detection apparatus 10 inputs data of the phase components of the template image, which has been transformed into frequency components in advance by an external device, in association with the frequency, and stores them to the template image storage section 18.

The transformation means 38 transforms the input image into the frequency components in a similar manner as the first example. The phase difference calculation means 42 calculates the phase component difference between the phase components of the template image stored on the template image storage section 18 and the phase components of the input image. The inversion means 52 transforms the phase component difference calculated by the phase difference calculation means 42 into phase impulse response function.

Figure 7:
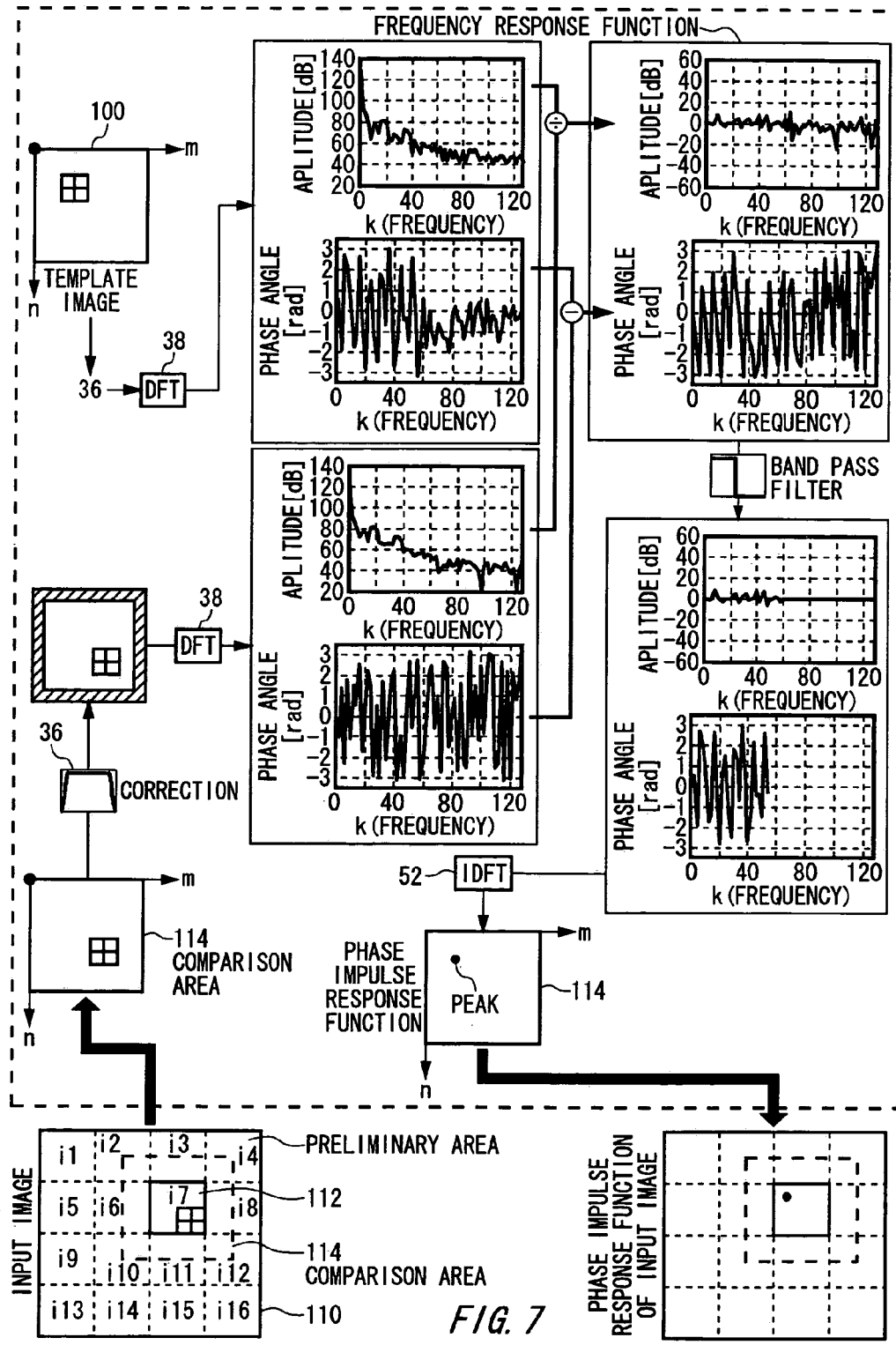
FIG. 7 is a schematic view of a third example of detecting the position of the mark similar to the template image from the input image by the position detection apparatus according to the present embodiment.

FIG. 7 is a schematic view of a third example of detecting the position of the mark similar to the template image from the input image by the position detection apparatus 10 according to the present embodiment.

In this example, the process for detecting the position of the mark from the input image by the position detection apparatus 10 when the input image 110 is larger than the template image 100 will be explained.

In this example, the input image dividing means 32 divides the input image 110 so that each of preliminary areas i1–i16 may become smaller than the template image. The comparison area selection means 34 selects a comparison area 114 so that one of the preliminary areas i1–i16 may be positioned at the center.

Alternatively, the comparison area selection means 34 further includes means for adjusting the number of pixels in the comparison area. For example, when selecting an area including the preliminary area i1, the comparison area selection means 34 adds pixels, each of which the pixel value is zero, so that the number of pixels of the comparison area may be substantially the same as that of the template image. Since the comparison area selection means 34 selects the comparison area having substantially the same size as the template image, the comparison area is transformable into frequency components with Fourier transformation by the transformation means 38.

It is preferable that the comparison area selection means 34 selects the comparison area in which the number of pixels in each dimension is mth power of 2 (m is a positive integer), respectively. Also in this case, the means for adjusting the number of pixels in the comparison area adjusts the number of pixels in the comparison area by adding pixels, each of which the pixel value is zero, so that the number of pixels in the selected comparison area in each dimension may be mth power of 2, respectively.

Since the comparison area selection means 34 selects the comparison area so that the number of pixels in the selected comparison area in each dimension may be mth power of 2, respectively, each comparison area is transformable into frequency components with fast Fourier transformation by the transformation means 38. Therefore, the calculation block 30 detects the position of the mark from the input image faster.

In a similar manner to the first example which uses the rectangle, axial-symmetric, two-dimensional cosine taper window, the correction means 36 corrects the pixel values in the comparison area so that the pixel values of the top edge and the bottom edge of the comparison area and the pixel values of the left edge and the right edge of the comparison area may become substantially the same as each other, respectively. In this case, it is preferable that the correction means 36 adjusts the value of α so that the rectangle area may become larger than each of the preliminary areas i1–i16. When the pixels, each of which the pixel value is zero, are added to the selected comparison area, it is also preferable that the correction means 36 adjusts the value of α so that the added pixels may not be included in the rectangle area. Moreover, the correction means 36 defines the values of Q and R so that the size of the window may become substantially equal to that of the comparison area. Since the correction means 36 adjusts the value of α so that the added pixels may not be included in the rectangle area, the continuity of the image can be maintained even when the pixels, each of which the pixel value is zero, are added to the comparison area. In addition to the comparison area, the correction means 36 may correct the pixel values in the template image so that the pixel values of the top edge and the bottom edge of the template image and the pixel values of the left edge and the right edge of the template image may become substantially the same as each other, respectively.

Here, since the comparison area selection means 34 selects each comparison area so that it may include preliminary areas smaller than the template image, any part on the input area is included in at least two comparison areas. Therefore, even if only a part of the mark is selected in a certain comparison area, the comparison area selection means 34 can select another comparison area on which whole part of the mark is included. Moreover, even if the mark is positioned in marginal area of a certain comparison area, the comparison area selection means 34 can select another comparison area of which the mark is positioned at the central area. Therefore, even if the correction means 36 corrects the pixel values at the edges of the comparison area, the position of the mark on the input area is correctly detectable by phase impulse response function of the comparison area in which the mark is positioned at the central area.

The transformation means 38 transforms the template image 100 and the comparison area 114 into frequency components in a similar manner to the first example. The phase difference calculation means 42 calculates the difference between the phase components of the template image and the phase components of the input image. In this examples, the band extraction filter 40 extracts the phase components of which the frequency k of the frequency component is less than or equal to 56.

In another example, the band extraction filter 40 extracts only the frequency components less than or equal to a predetermined frequency among the frequency components of the template image 100 and the comparison area, respectively, and the phase difference calculation means 42 calculates the difference between the phase components of the frequency components of the template image and the comparison area, each of which is extracted by the band extraction filter 40.

Since the band extraction filter 40 extracts only the frequency components less than or equal to the predetermined frequency, the influence of the frequency component generated by an object other than the mark (for example, the shape of a circuit pattern etc.) is removable. Moreover, since the high-frequency random noise is removable, the accuracy of phase impulse response function is improved.

The inversion means 52 transforms the phase component difference calculated by the phase difference calculation means 42 into impulse response function. Since the comparison area selection means 34 selects the comparison area so that the number of pixels in the selected comparison area in each dimension may be mth power of 2, respectively, the inversion means 52 calculates phase impulse response function by high-speed inverse Fourier transform. Therefore, the calculation block 30 can detect the position of the mark from the input image faster.

The coordinates detection means 54 detects coordinates at which the value of phase impulse response function takes the maximum in the selected comparison area 114. The comparison area detection means 56 detects the comparison area including the phase impulse response function of which the value is the maximum among the values of the phase impulse response function in the plurality of comparison areas. The mark judgment means 58 compares the maximum value of the phase impulse response function in the comparison area detected by the comparison area detection means 56 with a predetermined value. Then, when the maximum value of the phase impulse response function in the comparison area detected by the comparison area detection means 56 is greater than the predetermined value, the comparison area detection means 56 determines that the mark 112 is included in the detected comparison area.

When the maximum value of the phase impulse response function in the comparison area detected by the comparison area detection means 56 is not greater than the predetermined value, the comparison area detection means 56 determines that the mark 112 is not included in the detected comparison area. In this case, the input image dividing means 32 may divide the input image 110 into preliminary areas once again at different boundaries from the boundaries by which the input image 110 has been originally divided into the preliminary areas. The position detection apparatus 10 repeats the same processing, and detects the coordinates at which the maximum value of the phase impulse response function is greater than the predetermined value. When the coordinates, at which the value of the phase impulse response function is greater than the predetermined value, is not detected, the coordinates detection means 54 notifies the control section 20 that a mark is not included on the input image 110.

Since the inversion means 52 detects the position of the mark from the input image based on the phase impulse response function which is transformed from only the phase component difference, the position of a mark is detectable with sufficient accuracy from the input image while minimizing influence of variation of brightness distribution and deformation of the mark on the input image.

In another example, the coordinates detection means 54 selects only a predetermined area from the image indicating phase impulse response function. In this example, since the correction means 36 corrects the pixel values at the edges of the comparison area, the peak value of the phase impulse-response function generated due to the variation of the pixels at the edges of the comparison area is unreliable. Therefore, the coordinates detection means 54 selects the area which gives a reliable peak from the image indicating the value of the phase impulse response function based on a part of the comparison area corrected by the correction means 36. The coordinates detection means 54 generates an image indicating the phase impulse response function having substantially the same size as the input image by combining the area selected in this way with an area selected from another comparison area. In this case, the coordinates detection means 54 detects the coordinates, at which the value of the phase impulse response function takes the maximum, from the image indicating the combined phase impulse response function. Since the coordinates detection means 54 selects the predetermined area from the image indicating the phase impulse response function and detects the coordinates, at which the value of the phase impulse response function takes the maximum, from the selected area, the position of the mark is efficiently detectable from the input image.

Figure 8:
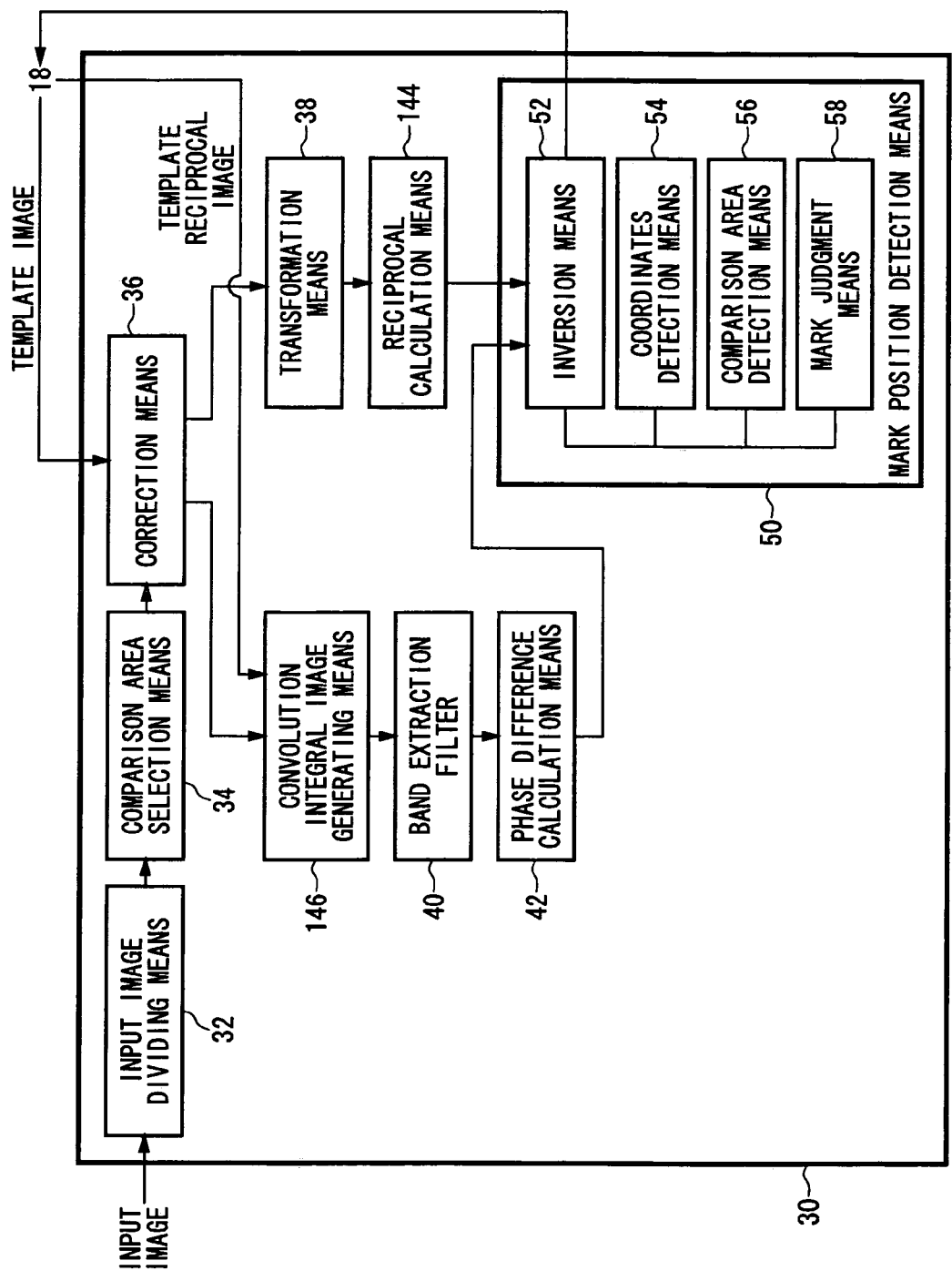
FIG. 8 is a block diagram showing another example of the calculation block of the position detection apparatus according to the present embodiment.

FIG. 8 is a block diagram showing another example of the calculation block 30 of the position detection apparatus.

The calculation block 30 includes input image dividing means 32, comparison area selection means 34, correction means 36, transformation means 38, a band extraction filter 40, phase difference calculation means 42, mark position detection means 50, reciprocal calculation means 144, and convolution integral image generating means 146. Component which bears the same reference numeral as the component shown in FIG. 2 has similar function to the component of the calculation block 30 shown in FIG. 2. The reciprocal calculation means 138 calculates the reciprocals of the frequency components of the template image. The convolution integral image generating means 146 generates a convolution integral image of a template reciprocal image having reciprocal frequency characteristic of the template image, and the input image.

Next, process of the calculation block 30 generating the template reciprocal image in this example will be explained. First, the correction means 36 corrects the pixel values at the edges of the template image stored on the template image storage section 18. The transformation means 38 transforms the pixel values of the template image into frequency components by fast Fourier transform. The reciprocal calculation means 138 calculates reciprocals of the frequency components of the transformed template image. The inversion means 52 transforms the reciprocals calculated by the reciprocal calculation means 138 by high-speed inverse Fourier transform to generate the template reciprocal image.

The template image storage section 18 stores the template reciprocal image. The convolution integral image generating means 146 generates the convolution integral image of the template reciprocal image stored on the template image storage section 18 and the input image. The transformation means 38 transforms the convolution integral image into frequency components with a reference point being set at a predetermined point on the convolution integral image. The phase difference calculation means 42 calculates the phase components of the convolution integral image transformed by the transformation means 38 as the phase component differences. The inversion means 52 transforms the phase component differences calculated by the phase difference calculation means 42 into phase impulse response function in a similar manner to the first example.

Since the inversion means 52 detects the position of the mark from the input image based on the phase impulse response function which is transformed from only the phase component difference, the position of a mark is detectable with sufficient accuracy from the input image while minimizing influence of variation of brightness distribution and deformation of the mark on the input image.

Figure 9:
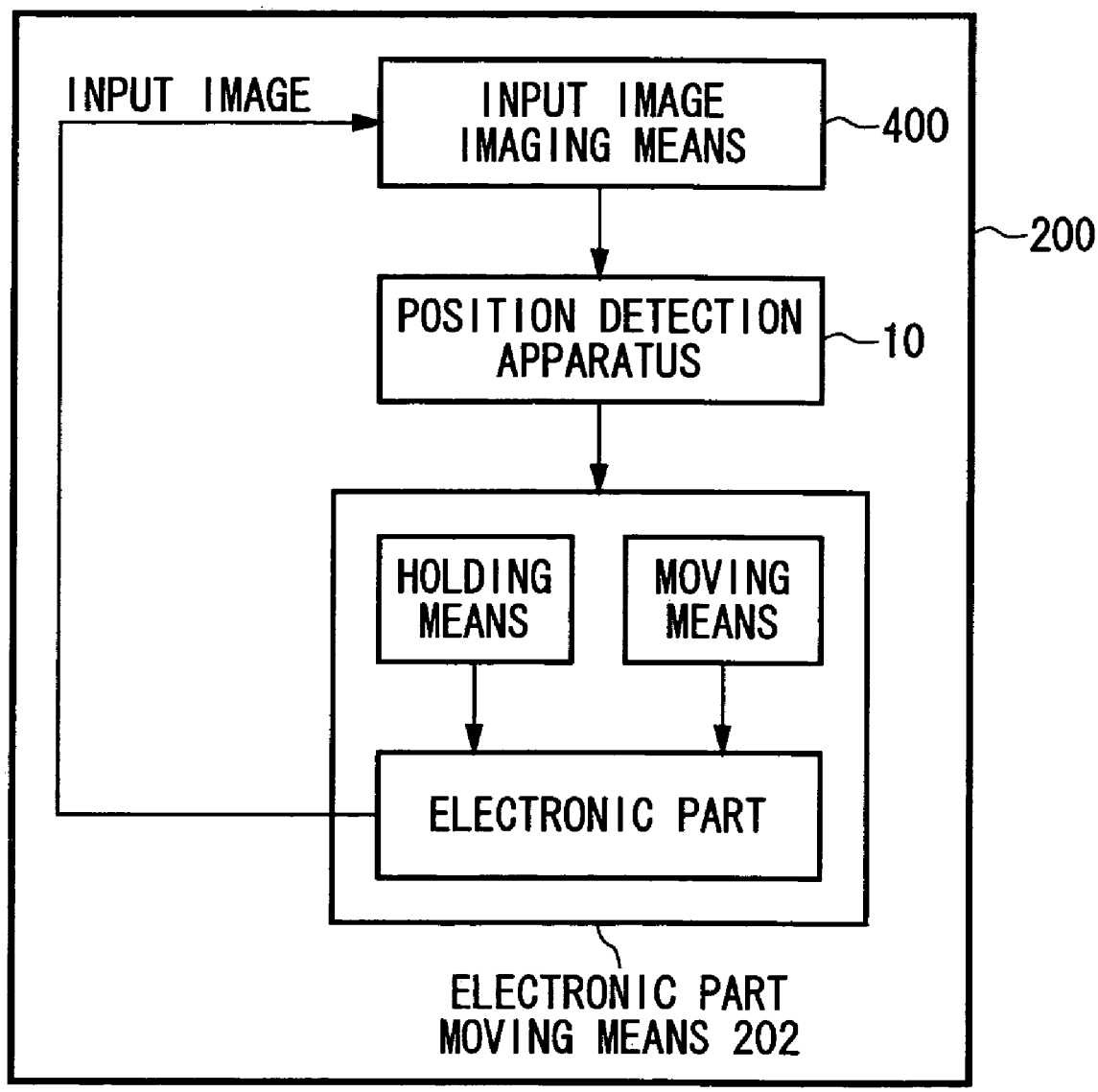
FIG. 9 is a block diagram showing the electronic part carrying apparatus according to a second embodiment of the present invention.

FIG. 9 is a block diagram showing the electronic part carrying apparatus according to a second embodiment of the present invention.

In the manufacturing process of electronic part, e.g., an IC such as large-scale integrated circuit (LSI), an IC package, etc., the electronic part carrying apparatus 200 transfers the electronic part to the apparatus which performs next process. Moreover, in the manufacturing process of the electronic part, the electronic part carrying apparatus 200 transfers the electronic part to a testing device, in order to test the performance of the electronic part, or transfers the tested electronic part back to a tray. In this example, the electronic part includes a mark similar to the template image.

The electronic part carrying apparatus 200 includes: input image imaging means 400 for imaging the mark as the input image; a position detection apparatus 10 for detecting the position of the mark from the input image; and electronic part moving means 202 for gripping the electronic part and moving the electronic part based on the position of the mark detected by the position detection apparatus 10. The position detection apparatus 10 has the similar configuration and function to the position detection apparatus 10 according to the first embodiment explained with reference to FIG. 1 to FIG. 8. It is preferable that the electronic part moving means 202 includes holding means for holding the electronic part and moving means for moving the electronic part.

Moreover, although the electronic part carrying apparatus 200 detects the mark of the electronic part and transfers the electronic part based on the position of the mark in this example, the electronic part carrying apparatus 200 detects the shape of the electronic part, and holds and moves the electronic part based on the shape in another example. For example, the input image imaging means 400 images a complete image of the electronic part as the input image, and the position detection apparatus 10 detects the electronic parts from the input image. In this case, it is preferable that the position detection apparatus 10 stores the template image indicating the shape of the electronic part. The electronic part moving means 202 holds and moves the electronic part based on the position of the detected electronic part. As explained in reference to FIG. 1 to FIG. 8, the position detection apparatus 10 can detect the position of the electronic part with sufficient accuracy from the input image.

In the present embodiment, since the electronic part carrying apparatus 200 includes the position detection apparatus 10, the position of the mark is detected from the input image based on phase impulse response function. Therefore, the position of a mark is detectable with sufficient accuracy from the input image while minimizing influence of variation of brightness distribution and deformation of the mark on the input image, and the electronic part is swiftly transferred with sufficient accuracy.

Figure 10:
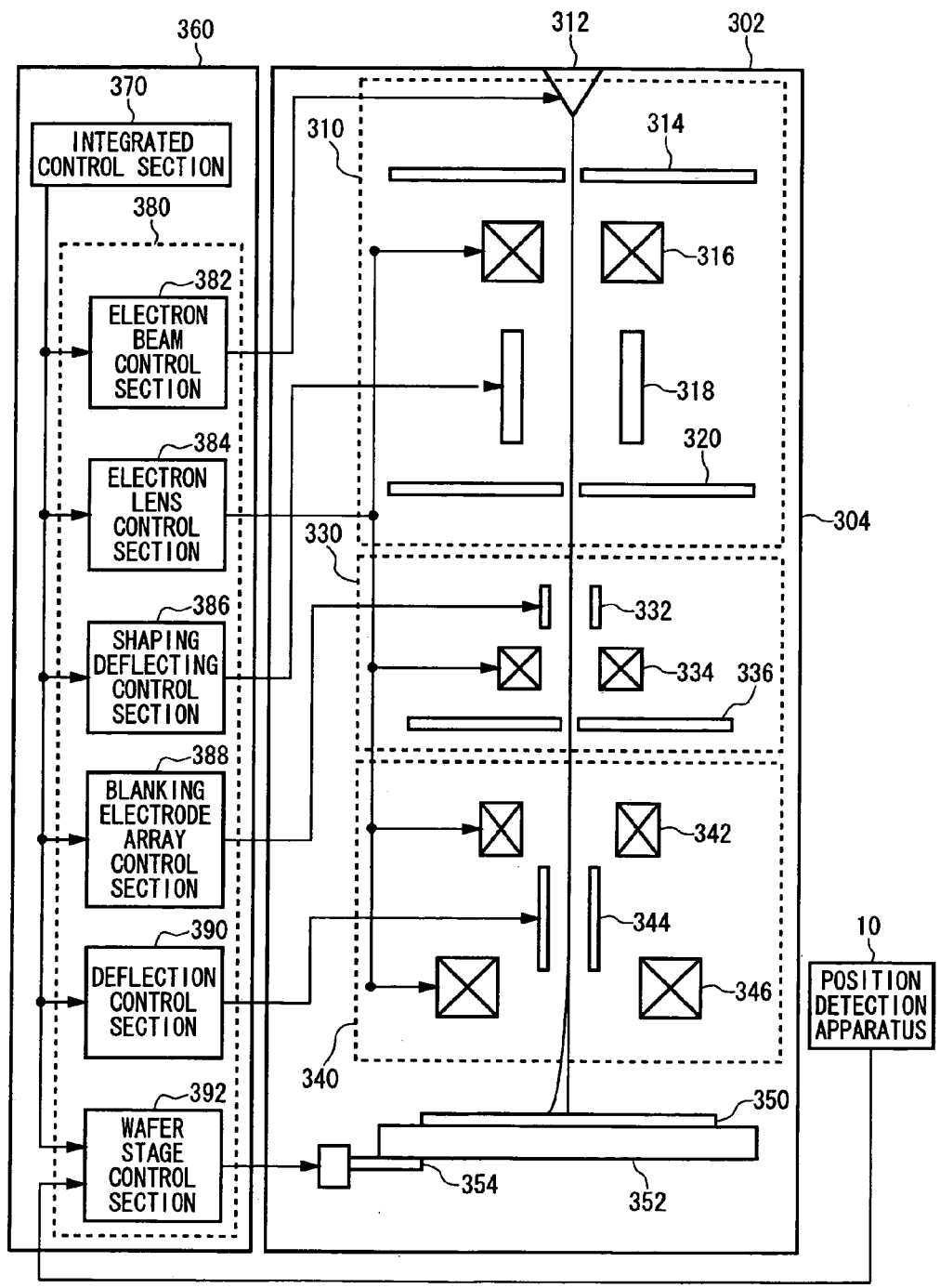
FIG. 10 is a block diagram of an electron beam exposure apparatus according to a third embodiment of the present invention.

FIG. 10 is a block diagram of an electron beam exposure apparatus 300 according to a third embodiment of the present invention. The electron beam exposure apparatus 300 includes: an exposure section 302 for performing predetermined exposure processing to a wafer 350 by an electron beam; a control system 360 for controlling operation of each component of the exposure section 302; and a position detection apparatus 10. The position detection apparatus 10 has the similar configuration and function to the position detection apparatus 10 according to the first embodiment explained with reference to FIG. 1 to FIG. 8.

The exposure section 302 includes an electron optical system, which includes: electron beam shaping means 310 for generating the electron beam and shaping cross-sectional shape of the electron beam into a desired shape in a chamber 304; blanking means 330 for selectively blanking the electron beam irradiated from the electron beam shaping means. 310 to the wafer 350; and a wafer projection system 340 for adjusting direction and size of a pattern image to be transferred to the wafer 350. Moreover, the exposure section 302 includes a stage system including a wafer stage 352 on which the wafer 350 is mounted, and a wafer stage drive section 354 for driving the wafer stage 352. In the present embodiment, a mark similar to the template image is provided on either the wafer 350 or the wafer stage 352 for detecting the position of the wafer.

The electron beam irradiation system 310 includes: an electron gun 312 for generating an electron beam; a first shaping member 314 with an aperture having rectangle shape for shaping cross-section of the electron beam by letting the electron beam pass through it; a first electron lens 316 for adjusting and focusing the electron beam; the shaping deflecting section 318 for deflecting the electron beam which has passed through the first shaping member 314; and a second shaping member 320. Alternatively, the shaping deflecting section 318 further includes means for deflecting the electron beam deflected by the shaping deflecting section 318 to a direction substantially perpendicular to the second shaping member 320.

The blanking means 330 includes: a plurality of blanking-electrode arrays 332 for switching whether the electron beam is irradiated onto the wafer 350 by selectively deflecting the electron beam; a second electron lens 334 for adjusting and focusing the electron beam; and an electron beam blocking member 336 with an aperture through which the electron beam passes for blocking the electron beam deflected by the blanking electrode arrays 332. The electron beam blocking member 336 includes a circular aperture (round aperture). The blanking electrode arrays 332 selectively deflect the electron beam so that the electron beam hits the outside of the round aperture of the electron beam blocking member 336 when the beam is deflected. That is, the blanking electrode arrays 332 can prevent the electron beam going to the downstream of the electron beam blocking member 336.

When the electron beam exposure apparatus 300 does not need to write a pattern to the wafer 350, e.g., when changing the patterns to be written by the electron beam exposure apparatus 300 to the wafer, or when changing areas on the wafer 350 to which the pattern is to be written, it is preferable that the blanking electrode arrays 332 deflect the electron beam so that the electron beam may not go to the downstream of the electron beam blocking member 336.

The wafer projection system 340 includes: a third electron lens 342 for adjusting reduction ratio of the pattern image written to the wafer 350 to the pattern formed in the second shaping member 120; a deflecting section 344 for deflecting the electron beam so that the electron beam may be applied to a predetermined area on the wafer 350; and a fourth electron lens which functions as an objective lens.

The control system 360 includes an integrated control section 370 and an individual control section 380. The individual control section 380 includes an electron beam control section 382, an electron lens control section 384, a shaping deflecting control section 386, a blanking electrode array control section 388, a deflection control section 390, and a wafer stage control section 392. For example, the integrated control section 370 is a work station, and correctively controls each control section in the individual control section 380.

The electron beam control section 382 controls the electron gun 312. The electron lens control section 384 controls the current supplied to the first electron lens 316, the second electron lens 334, the third electron lens 342, and the fourth electron lens 346. The shaping deflecting control section 386 controls the shaping deflecting section 318. The blanking electrode array control section 388 controls the voltage applied to deflecting electrodes of the blanking electrode arrays 332. The deflecting control section 390 controls the deflecting section 344. Based on the position of the mark detected by the position detection apparatus 10, the wafer stage control section 392 controls the wafer stage drive section 354, and moves the wafer stage 352 to a predetermined position.

With reference to FIG. 10, operation of the electron beam exposure apparatus 300 according to the present embodiment will be explained. The wafer 350, on which exposure processing is performed, is provided on the wafer stage 352. Since it takes a predetermined time to stabilize the electron beam generated by the electron gun 312, the electron gun 312 generates the electron beam continuously during the period of the exposure processing in the present embodiment. A solid line depicted in FIG. 10 shows the irradiation path of the electron beam.

The imaging apparatus 12 of the position detection apparatus 10 takes the image of the mark provided on the wafer 350 or the wafer stage 352 as an input image. The position detection apparatus 10 detects the position of the mark from the input image using the phase impulse response function explained in the first embodiment. Then, the wafer stage control section 392 controls the wafer stage drive section 354 based on the position of the mark detected by the position detection apparatus 10, and causes the wafer stage 352 to move so that the area on the wafer 350 to be exposed may be located in the vicinity of the optical axis of the electron beam.

The blanking electrode array control section 388 controls the blanking electrode arrays 332 so that the electron beam going to the wafer 350 which has passed through the aperture of the second shaping member 120 may not be applied on the wafer 350 before the exposure processing is started.

The electron lens control section 384 controls the current supplied to the first electron lens 316, the second electron lens 334, the third electron lens 342, and the fourth electron lens 346 so that the electron beam generated by the electron gun 312 may be focused onto the wafer 350. The electron beam generated by the electron gun 312 is applied on the first shaping member 314 and is shaped thereby. The electron beam shaped by the first shaping member 314 is applied on the second shaping member 320. The electron beam is shaped into the desired shape which is to be applied on the wafer 350 by the second shaping member 320. The blanking electrode array control section 388 controls the blanking electrode arrays 332 to stop the deflection of the electron beam so that the electron beam shaped by the second shaping member 320 is to be applied on the wafer 350. The blanking electrode array control section 388 stops the deflection of the electron beam deflected by the blanking electrode arrays 332. Then, the electron beam which is not deflected by the blanking electrode arrays 332 passes through the round aperture of the electron beam blocking member 336 after the diameter of the electron beam is reduced by the second electron lens 334.

The reduction ratio of the pattern image of the electron beam which has passed through the electron beam blocking member 336 is adjusted by the third electron lens 342. Then, the electron beam is deflected by the deflecting section 344 so that it may be applied to a predetermined area on the wafer 350. The electron beam is further adjusted by the fourth electron lens 346, and is applied on the wafer 350.

After a predetermined exposure time has elapsed, the blanking electrode array control section 390 controls the blanking electrode arrays 332 to deflect the electron beam so that the electron beam may not be applied on the wafer 350. The pattern is written to the predetermined area on the wafer 350 by the above process. The electron beam exposure apparatus 300 can write a desired circuit pattern to the wafer 350 by repeating the exposure processing.

Alternatively, the electron beam exposure apparatus 300 is an electron beam exposure apparatus which employs a variable rectangle, or an electron beam exposure apparatus employing a blanking aperture array (BAA) device.

In the present embodiment, since the electron beam exposure apparatus 300 includes the position detection apparatus 10, the position of a mark is detected from the input image based on phase impulse response function. Therefore, the position of a mark is detectable with sufficient accuracy from the input image while minimizing influence of variation of brightness distribution and deformation of the mark on the input image, and the wafer 350 is promptly exposed with sufficient accuracy.

As it is obvious from the foregoing explanation, according to the present invention, the position of a mark is detectable with sufficient accuracy from the input image while minimizing influence of variation of brightness distribution and deformation of the mark on the input image.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. A position detection apparatus for detecting a position of a mark similar to a template image from an input image, comprising:

phase difference calculation means for calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and mark position detection means for transforming the phase component difference calculated by said phase difference calculation means into phase impulse response function, and for detecting a position of the mark on the input image based on the phase impulse response function.

2. A position detection method for detecting a position of a mark similar to a template image from an input image, comprising steps of:

calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and detecting a position of the mark on the input image based on the phase impulse response function, said mark position detection step comprising a step of transforming the phase component difference into phase impulse response function.

3. The position detection method as claimed in claim 2, wherein the phase component difference is calculated in said phase component difference calculation step based on frequency response function of the input image relative to the template image.

4. The position detection method as claimed in claims 2, wherein said mark position detection step comprises a step of
detecting coordinates, which give a value of phase
impulse response function satisfying a predetermined
condition, from the input image, and
the position of the mark is detected based on the detected
coordinates.

5. The position detection method as claimed in claim 4, wherein coordinates, of which absolute value of difference between the value of phase impulse response function and a predetermined value takes the maximum, are detected in said coordinates detection step.

6. The position detection method as claimed in claim 4, wherein coordinates, of which the value of the phase impulse response function takes a local extremum, are detected in said coordinates detection step.

7. The position detection method as claimed in claim 2, further comprising a step of transforming the input image into the frequency components.

8. The position detection method as claimed in claim 7, further comprising a step of selecting a comparison area, of which the size is substantially the same as that of the template image, from the input image, wherein
the comparison area is transformed into the frequency components in said transformation step with a reference point on the input image being set at coordinates on the comparison area corresponding to the predetermined position set as the reference point on the template image.

9. The position detection method as claimed in claim 8, further comprising a step of dividing the input image into preliminary areas, each of which the size is smaller than that of the template image, wherein
the comparison area is selected in said comparison area selection step so that each of the preliminary are as may be included in predetermined positions, respectively.

10. The position detection method as claimed in claim 8, further comprising a step of correcting pixel values of the comparison area so that pixel values at edges of the comparison area may become substantially equal to one another.

11. The position detection method as claimed in claim 8, wherein
said mark position detection step further comprises a step of detecting the comparison area including the coordinates which give the value of the phase impulse response function satisfying a predetermined condition based on the phase impulse response function converted from the phase component difference, wherein
the position of the mark is detected based on the position of the comparison area in the input image and the coordinates in the comparison area.

12. The position detection method as claimed in claim 8, wherein said mark position detection step further comprises steps of:
selecting a predetermined area from the comparison area;
extracting values of phase impulse response function in the predetermined area; and
selecting a value of the phase impulse response function, which satisfies a predetermined condition, from the extracted phase impulse response function values, wherein
coordinates which give the selected phase impulse response function value are detected in said mark position detection step.

13. The position detection method as claimed in claim 8, wherein said mark position detection step comprises a step of judging whether the mark is included in the comparison area by comparing the value of the phase impulse response function in the comparison area with a predetermined threshold based on the phase impulse response function which is transformed from the phase component difference of the comparison area.

14. The position detection method as claimed in claim 2, further comprising a step of extracting the phase component of a predetermined frequency component, wherein
the position of the mark on the input image is detected in said mark position detection step based on the phase component difference between the phase component of the template image extracted in said band extraction step, and the phase component of the input image extracted in said band extraction step.

15. The position detection method as claimed in claim 2, further comprising a step of storing the phase component of each frequency component defined based on a value of amplitude of the frequency component of the frequency-transformed template image in association with the frequency component, wherein
the phase component difference between the phase component of each frequency component corresponding to each of the frequency components stored in said template frequency storage step among the phase components of the frequency-transformed input image, and the phase component of each frequency component of the template image stored in said template frequency storage step, is calculated in said phase component difference calculation step.

16. The position detection method as claimed in claim 2, further comprising a step of storing the phase components of frequency-transformed template image in association with the frequency components.

17. The position detection method as claimed in claim 2, further comprising a step of correcting pixel values of the template image so that pixel values at edges of the template image may become substantially equal to one another.

18. The position detection method as claimed in claim 2, further comprising steps of:
storing a template reciprocal image having reciprocal frequency characteristic of the template image;
generating a convolution integral image of the template reciprocal image and the input image; and
transforming the convolution integral image into frequency components with a reference point being set at a predetermined point, wherein
a phase component of the convolution integral image with a reference point being set at a predetermined point on the convolution integral image is calculated as the phase component difference in said phase component difference calculation step.

19. The position detection method as claimed in claim 18, further comprising steps of:
transforming the template image into frequency components by two-dimensional discrete Fourier transform; and
generating the template reciprocal image by calculating reciprocals of the frequency components of the transformed template image and by transforming the reciprocals by two-dimensional discrete Fourier transform.

20. An electron beam exposure apparatus for exposing a pattern on a wafer by an electron beam, comprising:
an electron beam generating section for generating the electron beam;
a wafer stage mounting thereon the wafer;
input image imaging means for imaging an image of a mark as an input image, the mark being provided on either the wafer or the wafer stage, and being similar to a template image for detecting a position of a wafer; and a position detection apparatus for detecting the position of the mark from the input image, wherein said position detection apparatus comprises:

phase difference calculation means for calculating phase component difference between phase component of each frequency component of the template image transformed into frequency components with a reference point being set at a predetermined point on the template image, and a phase component of each frequency component of the input image transformed into frequency components with a reference point being set at a predetermined point on the input image; and a mark position detection means for detecting the position of the mark on the input image based on phase impulse response function which is transformed from the phase component difference calculated by said phase difference calculation means.

* * * * *